(12) United States Patent
Cheng

(10) Patent No.: US 10,008,279 B1
(45) Date of Patent: Jun. 26, 2018

(54) READ ONLY MEMORY AND DATA READ METHOD THEREOF

(71) Applicant: United Microelectronics Corp., Hsinchu (TW)

(72) Inventor: Chung-Hao Cheng, Taoyuan (TW)

(73) Assignee: United Microelectronics Corp., Hsinchu (TW)

(*) Notice: Subject to any disclaimer, the term of this patent is extended or adjusted under 35 U.S.C. 154(b) by 0 days. days.

(21) Appl. No.: 15/436,453

(22) Filed: Feb. 17, 2017

(51) Int. Cl.
*G11C 17/02* (2006.01)
*G11C 17/08* (2006.01)

(52) U.S. Cl.
CPC .................................. *G11C 17/08* (2013.01)

(58) Field of Classification Search
CPC . G11C 16/3454; G11C 16/3459; G11C 17/14; G11C 17/16; G11C 17/165; G11C 19/00; G11C 2029/0407; G11C 29/027; G11C 29/52; G11C 5/143
See application file for complete search history.

(56) References Cited

U.S. PATENT DOCUMENTS 5,949,704 A * 9/1999 Shone ................... H01L 27/112 257/390
7,127,616 B2 * 10/2006 Kaneko ................. G06F 21/75 713/191
7,301,819 B2 11/2007 Khanuja
2007/0020842 A1 * 1/2007 Tang ..................... H01L 27/112 438/233
2016/0276331 A1 * 9/2016 Liaw ................... H01L 27/1124

OTHER PUBLICATIONS

Po-Han Jen, et al., "Mask ROM and Process for Fabricating the Same," Unpublished U.S. Appl. No. 15/264,423, filed Sep. 13, 2016.

* cited by examiner

*Primary Examiner* — Hien Nguyen
(74) *Attorney, Agent, or Firm* — J.C. Patents

(57) ABSTRACT

A read only memory including a ROM cell array, a plurality of word lines and a plurality of bit lines and a word line driver. The ROM cell array has a plurality of ROM cells. Each of the ROM cells coupled to corresponding bit line and corresponding word line. The word line driver is coupled to the word lines, and respectively provides a plurality of word line signals to the word lines. Each of the ROM cells is a first type ROM cell or a second type ROM cell. The first type ROM cell includes a first top metal structure and a first bottom metal structure. The first bottom metal structure is electrically isolated from the first top metal structure. The second type ROM cell includes a second top metal structure, a second bottom metal structure, and a connection structure. The connection structure is electrically connected the second top metal structure and the second bottom metal structure.

13 Claims, 5 Drawing Sheets

READ ONLY MEMORY AND DATA READ METHOD THEREOF

BACKGROUND

Field of the Invention

The invention relates to a read only memory (ROM) and a data read method thereof. Particularly, the invention relates to the ROM with ROM cells having small circuit size and the data read method for driving word lines by a virtual ground scheme.

Description of Related Art

In conventional read only memory (ROM) cell, a transistor is disposed between a bit line and a source line. A code of the ROM can be determined by whether the transistor is connected to the bit line or not. That is, in the conventional art, a plurality of transistors are necessary in a ROM array, and number of the transistors is positive proportional to a size of the ROM array, and the circuit size and cost are increased correspondingly. Besides, when large number of transistors connected to a same bit line, performance of both of current leakage and power consumption are reduced.

SUMMARY OF THE INVENTION

The invention is directed to a read only memory (ROM), which can reduce a circuit size of each of ROM cells in the ROM.

The invention provides a read only memory including a ROM cell array, a plurality of word lines and a plurality of bit lines and a word line driver. The ROM cell array has a plurality of ROM cells. Each of the ROM cells coupled to corresponding bit line and corresponding word line. The word line driver is coupled to the word lines, and respectively provides a plurality of word line signals to the word lines. Each of the ROM cells is a first type ROM cell or a second type ROM cell. The first type ROM cell includes a first top metal structure and a first bottom metal structure. The first bottom metal structure is electrically isolated from the first top metal structure. The second type ROM cell includes a second top metal structure, a second bottom metal structure, and a connection structure. The connection structure electrically connectes the second top metal structure and the second bottom metal structure.

The invention also provides a data read method for reading data from the ROM mentioned above. Steps of the data read method includes: pre-charging at least one selected bit line to a first voltage; setting a selected word line to a reference voltage and floating a plurality of un-selected word lines by the word line driver; and sensing a read-out data according to a voltage level on the at least one selected bit line, wherein, a voltage level of the first voltage is different from a voltage level of the reference voltage.

According to the above descriptions, in the invention, ROM cells without transistor can be implemented in a ROM. The circuit size of each of the ROM cells can be reduced accordingly. Further, the word line driver drives the word lines by a virtual ground scheme, and no leakage can be occurred when the word lines are not selected.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
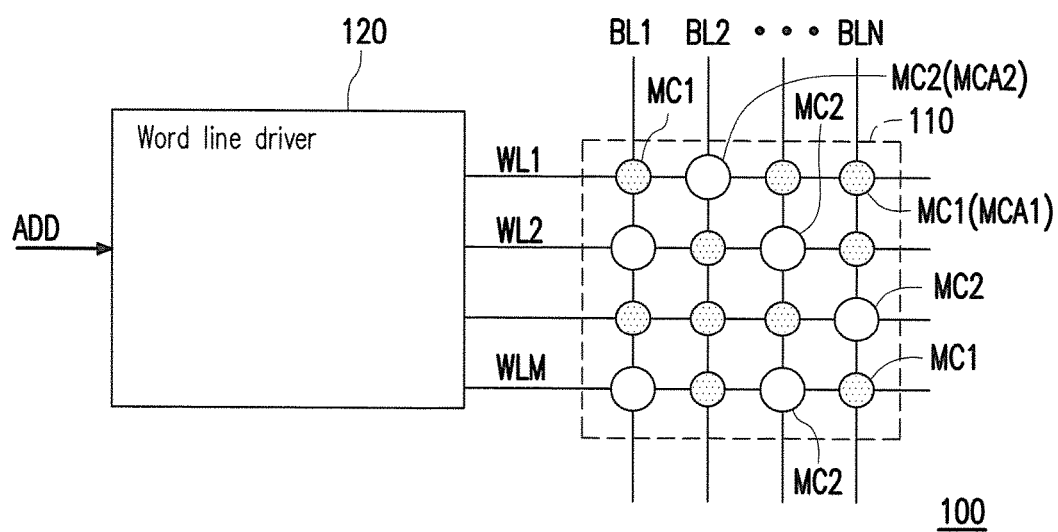
FIG. 1 is a schematic diagram of a read only memory (ROM) according to an embodiment of present disclosure.

Referring to FIG. 1, which is a schematic diagram of a read only memory (ROM) according to an embodiment of present disclosure. The ROM 100 includes a ROM cell any 110, a plurality of word lines WL1-WLM and bit lines BL1-BLN, and a word line driver 120. The ROM cell array 110 includes a plurality of ROM cells MC1 and MC2, where the ROM cells MC1 are first type ROM cells and the ROM cells MC2 are second type ROM cells. Each of the ROM cells MC1 and MC2 is coupled to corresponding bit line and word line.

The word line driver 120 is coupled to the word lines WL1-WLM, and provides a plurality of word line signals to the word lines WL1-WLM, respectively. Herein, during a data reading operation, one of the word lines WL1-WLM can be selected to be a selected word line, and the other word lines are un-selected word lines.

Figure 2A:
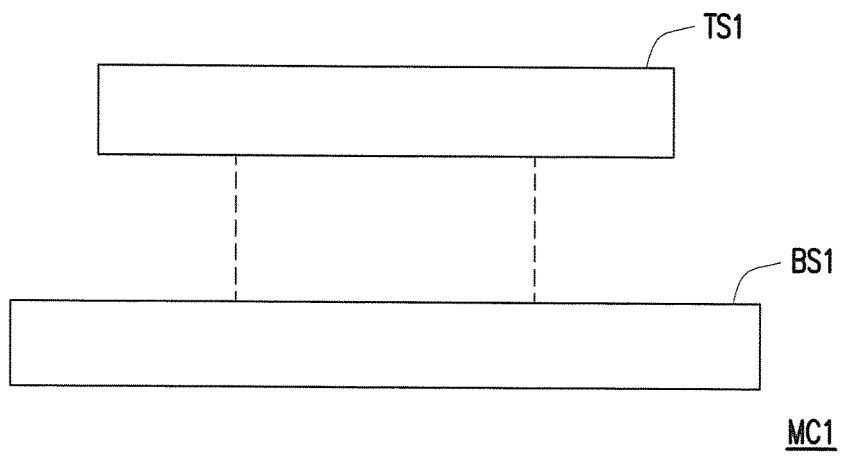
FIG. 2A and FIG. 2B respectively illustrate structures of the first type ROM cell and the second type ROM cell according to an embodiment of present disclosure.
Figure 2B:
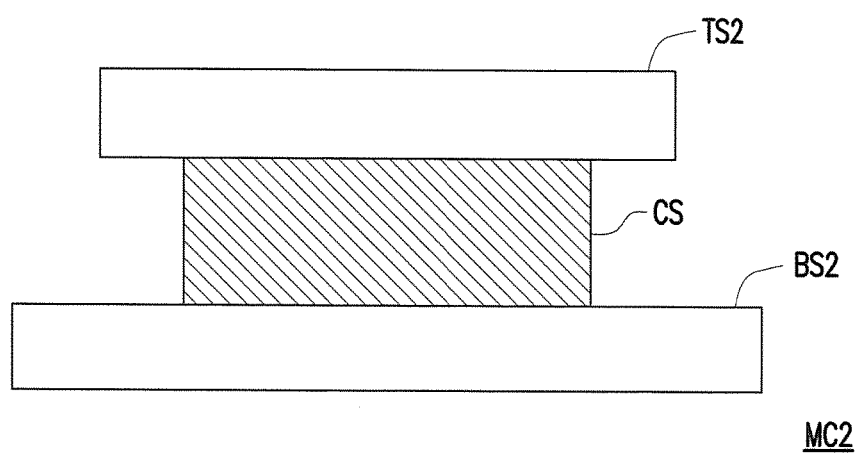

It should be noted here, a structure of the first type ROM cell is different from a structure of the second type ROM cell. Referring to FIG. 2A and FIG. 2B, which respectively illustrate structures of the first type ROM cell and the second type ROM cell according to an embodiment of present disclosure. In FIG. 2A, the first type ROM cell MC1 includes a top metal structure TS1 and a bottom metal structure BS1. The top metal structure TS1 and the bottom metal structure BS1 are overlapped, and the top metal structure TS1 and the bottom metal structure BS1 are electrically isolated from each other.

In some embodiment, in the first type ROM cell MC1, a di-electric structure may be implemented between the top metal structure TS1 and the bottom metal structure BS1. Or, in other embodiments, the top metal structure TS1 and the bottom metal structure BS1 may be isolated by air.

In the ROM cell array 110, the top metal structure TS1 may be used to be electrically coupled to corresponding bit line and the bottom metal structure BS1 may be used to be electrically coupled to corresponding word line. Or, in another embodiment, the top metal structure TS1 may be used to be electrically coupled to corresponding word line and the bottom metal structure BS1 may be used to be electrically coupled to corresponding bit line.

In FIG. 2B, the second type ROM cell MC1 includes a top metal structure TS2 and a bottom metal structure BS2. Furthermore, a connection structure CS is disposed between the top metal structure TS2 and the bottom metal structure BS2. The top metal structure TS2 and the bottom metal structure BS2 are electrically connected by the connection structure CS. In detail, the top metal structure TS2 contact with a first end of the connection structure CS, and a second end of the connection structure CS contact with the bottom metal structure BS2.

In the ROM cell array 110, the top metal structure TS2 may be used to be electrically coupled to corresponding bit line and the bottom metal structure BS2 may be used to be electrically coupled to corresponding word line. Or, in another embodiment, the top metal structure TS2 may be used to be electrically coupled to corresponding word line and the bottom metal structure BS2 may be used to be electrically coupled to corresponding bit line.

Referring to FIG. 1 again, the first type ROM cell MC1 may be used to store a data with a first logic value (i.e., logic 1), and the second type ROM cell MC2 may be used to store a data with a second logic value (i.e., logic 0). The first logic value and the second logic value are complementary.

In detail operation, when a data read operation is operating on the ROM 100, the bit lines BL1-BLN which are selected for the data read operation are pre-charge to a first voltage. During the data read operation, the word line driver 120 receives a row address ADD, and select one of the word lines WL1-WLM to be a selected word line according to the row address ADD. Then, the word line driver 120 sets a word line signal on the selected word line to a reference voltage and floats all the un-selected word lines. Wherein, the reference voltage is different from the first voltage. For example, if the ROM cell MCA2 is selected to be read. The bit line BL2 and the top metal structure of the ROM cell MCA2 are pre-charged to the first voltage firstly. Then, the word line WL1 is the selected word line, and the reference voltage is provided to the bottom metal structure of the ROM cell MCA2 through the word line WL1. Since the ROM cell MCA2 is the second type ROM cell, the voltage on the bit line BL2 is pulled to the reference voltage, and a data of the ROM cell MCA2 can be sensed by comparing the voltage on the bit line BL2 (equals to the reference voltage) with a threshold voltage.

In another example, if the ROM cell MCA1 is selected to be read. The bit line BLN and the top metal structure of the ROM cell MCA1 are pre-charged to the first voltage firstly. Then, the word line WL1 is the selected word line, and the reference voltage is provided to the bottom metal structure of the ROM cell MCA2 through the word line WL1. Since the ROM cell MCA1 is the first type ROM cell, the voltage on the bit line BL1 holds on the first voltage, and a data of the ROM cell MCA1 can be sensed by comparing the voltage on the bit line BLN (equals to the first voltage) with a threshold voltage. In the embodiment, the first voltage may be larger than the reference voltage, and the reference voltage may be a reference ground.

Figure 3:
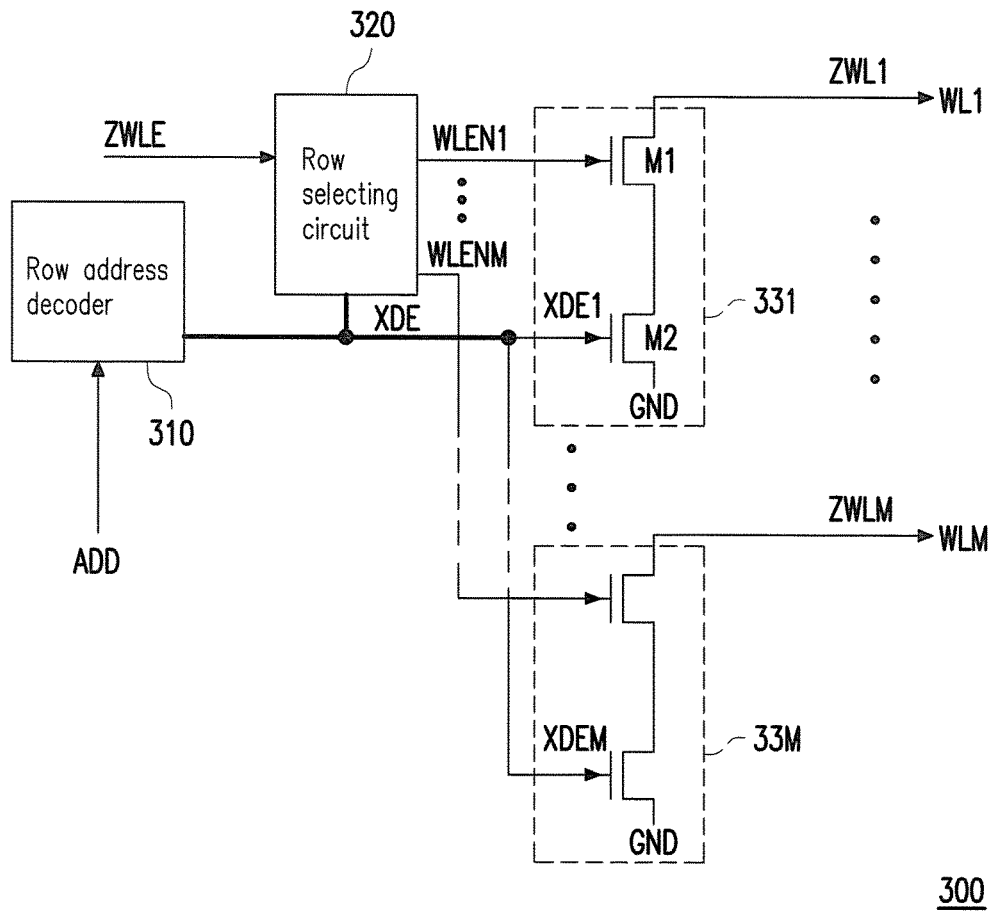
FIG. 3 is a schematic diagram of the word line driver according to an embodiment of present disclosure.

Referring to FIG. 3, which is a schematic diagram of the word line driver according to an embodiment of present disclosure. The word line driver 300 includes a row address decoder 310, a row selecting circuit 320 and a plurality of driving stages 331-33M. The address decoder 310 receives a row address ADD, and decodes the row address ADD to generate a control signal XDE. The control signal XDE is sent to the row selecting circuit 320 and the driving stages 331-33M. The row selecting circuit 320 is coupled to the row address decoder 310, and generates a plurality of word line enable signals WLEN1-WLENM according to the control signal XDE and an enable signal ZWLE.

Each of the driving stages 331-33M includes two transistors. Take the driving stage 331 for an example, the driving stage 331 includes a transistor M1 and a transistor M2. A first end of the transistor M1 is coupled to the word line WL1 for providing a word line signal ZWL1, a control end of the transistor M1 receives corresponding word line enable signal WLEN1. A first end of the transistor M2 is coupled to a second end of the transistor M1, a control end of the transistor M2 receives the corresponding control signal)(DEL and a second end of the transistor receives the reference voltage (i.e., the reference ground GND).

If the word line WL1 is the selected word line, the row address decoder 310 provides the control signal XDE1 with enabled level (i.e., logic 1). The row selecting circuit 320 provides the word line enable signal WLEN1 with enabled level (i.e., logic 1) according to the control signal XDE1 and the enable signal ZWLE, too. Such as that, both of the transistors M1 and M2 are turned on, and the word line signal ZWL1 with the reference voltage (equals to the reference ground GND) can be provided to the word line WL1. At the same time, since the word line WLM is un-selected word line, the control signal XDEM with disabled level (i.e., logic 0) and the word line enable signal WLENM with disabled level (i.e., logic 0) are sent to the driving stage 33M, and the two transistors of the driving stage 33M are cut-off accordingly. The word line signal ZWLM is high impedance, and the word line WLM can be floated.

Figure 4:
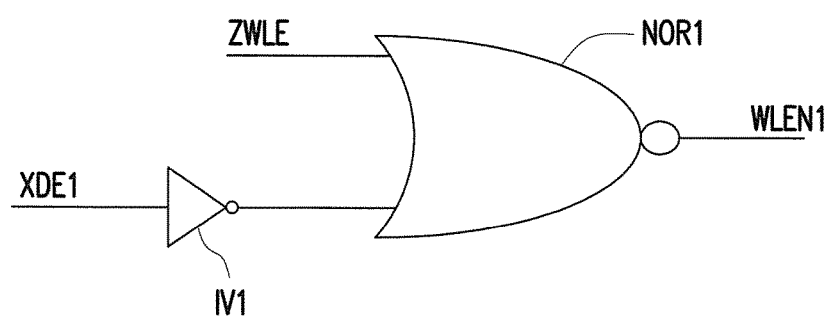
FIG. 4 is a schematic diagram of a part of circuit of the row selecting circuit according to an embodiment of present disclosure.

Referring to FIG. 4, which is a schematic diagram of a part of circuit of the row selecting circuit according to an embodiment of present disclosure. The row selecting circuit 320 can be implemented by a plurality of circuit in FIG. 4. Herein, one word line enable signal WLEN1 may be generated by an inverter IV1 and a NOR gate NOR1. The inverter IV1 receives the control signal XDE1. The NOR gate receives the enable signal ZWLE by one input end, and is coupled to an output end of the inverter IV1 by another input end. The NOR gate has an output end for generating the word line enable signal WLEN1.

It should be noted here, if a data read operation is operated, the enable signal ZWLE may be enabled firstly, and then, the control signal XDE1 can be set to enabled or disabled by the row address decoder.

Figure 5:
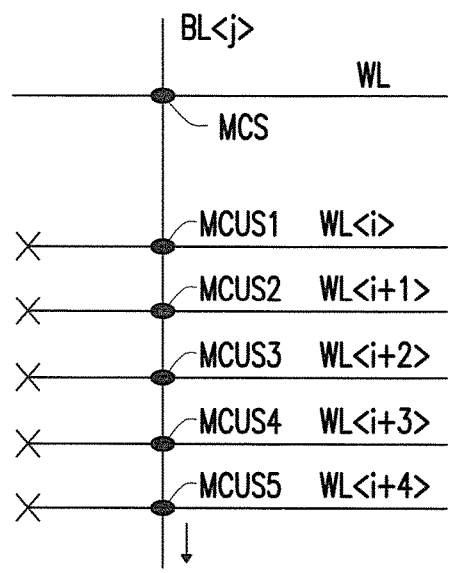
FIG. 5 is a schematic diagram of one ROM cell column for data read operation according to an embodiment of present disclosure.

Referring to FIG. 5, which is a schematic diagram of one ROM cell column for data read operation according to an embodiment of present disclosure. In FIG. 5, if a data read operation is operated, the bit line BL<j> is pre-charge to a first voltage, firstly. Then, the word line WL is a selected word line for the data read operation, and the word lines WL<i>-WL<i+4> are un-selected word lines. A reference voltage is provided to the word line WL, and all of the word lines WL<i>-WL<i+4> are floated. Such as that, voltage on the bit line BL<j> is determined by the ROM cell MCS and not effected by the ROM cell MCUS1-MCUS5. If the ROM cell MCS is the first type ROM cell, the voltage on the bit line BL<j> can be held on the first voltage. On the contrary, if the ROM cell MCS is the second type ROM cell, the voltage on the bit line BL<j> can be pulled-down to the reference ground. The voltage on the bit line BL<j> can be transported to a sense amplifier, and a read-out data can be obtained by comparing the voltage on the bit line BL<j> with a threshold voltage.

Figure 6:
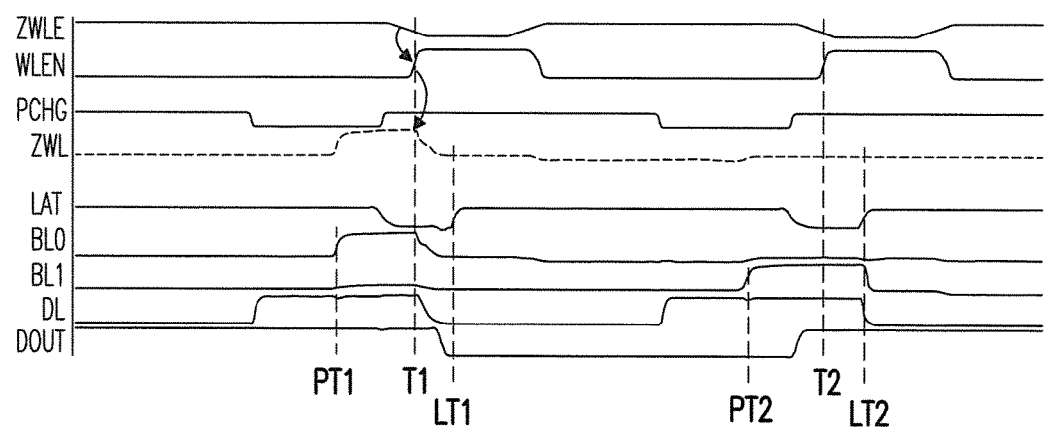
FIG. 6 illustrates a waveform plot of a data read operation for the ROM according to an embodiment of present disclosure.

Referring to FIG. 6, which illustrates a waveform plot of a data read operation for the ROM according to an embodiment of present disclosure. In FIG. 6, at a time PT1, the bit line BL0 is pre-charged to a first voltage. Then, at time T1, the enable signal ZWLE is enabled, and the word line enable signal WLEN is pulled to high accordingly. According to the word line enable signal WLEN which is pulled-high, the selected word line signal ZWL is enabled (be pulled down), and a stored data in the selected ROM cell coupled to the bit line BL0 can be sensed by the bit line BL0. Since the selected ROM cell is a second type ROM cell, voltage on the bit line BL0 can be pulled down and a read-out data DOUT (logic 0) can be obtained by a lath signal LAT for latching the data line signal DL at a latch time LT1.

On another case, at a time PT2, the bit line BL1 is pre-charged to a first voltage. Then, at time T2, the enable signal ZWLE is enabled again, and the word line enable signal WLEN is pulled to high accordingly. According to the word line enable signal WLEN which is pulled-high, the selected word line signal ZWL is enabled (be pulled down), and a stored data in the selected ROM cell coupled to the bit line BL1 can be sensed by the bit line BL1. Since the selected ROM cell is a first type ROM cell, voltage on the bit line BL1 can be held on the first voltage and the read-out data DOUT (logic 1) can be obtained by the lath signal LAT for latching the data line signal DL at a latch time LT2.

Please be noted here, the read-out data DOUT may be obtained by a sense amplifier. The sense amplifier may compare the voltage level on the at least one selected bit line (ex. The bit line BL1) with a threshold voltage to generate a comparison result, and the read-out data DOUT can be obtained according to the comparison result. For example, if the voltage level on the selected bit line BL1 is larger than the threshold voltage, the read-out DOUT may be a first logic value (ex. logic 1); and if the voltage level on the selected bit line BL1 is smaller than the threshold voltage, the read-out DOUT may be a second logic value (ex. logic 0). Moreover, the threshold voltage is a pre-set value, and may be determined by a designer of the ROM.

Figure 7:
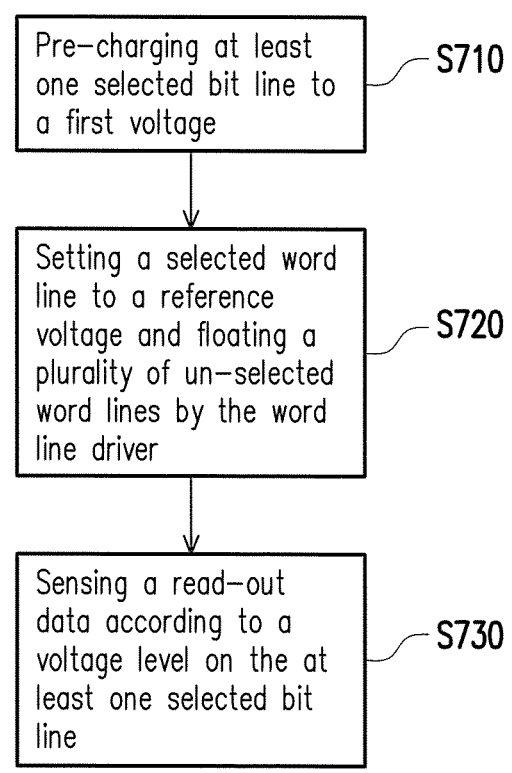
FIG. 7 is a flow diagram of a data read method according to an embodiment of present disclosure.

Referring to FIG. 7, which is a flow diagram of a data read method according to an embodiment of present disclosure. A step S710 is executed for pre-charging at least one selected bit line to a first voltage. A step S720 is executed for setting a selected word line to a reference voltage and floating a plurality of un-selected word lines by the word line driver. Then, a step S730 is executed for sensing a read-out data according to a voltage level on the at least one selected bit line, wherein, a voltage level of the first voltage is different from a voltage level of the reference voltage.

The detail operations of the steps S710-S730 have been described in the embodiments mentioned above, and no more repeated descriptions here.

In summary, present disclosure provides a ROM cell without transistor, and circuit size of the ROM can be reduced. Furthermore, present disclosure provides a virtual ground scheme for reading data from the ROM cells, current leakage form the un-selected word line can be avoided. Performance of the ROM of present disclosure can be increased.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A read only memory (ROM), comprising:
    a ROM cell array, having a plurality of ROM cells;
    a plurality of word lines and a plurality of bit lines, disposed on the ROM cell array, and each of the ROM cells coupled to corresponding bit line and corresponding word line; and
    a word line driver, coupled to the word lines, respectively providing a plurality of word line signals to the word lines,
    wherein, each of the ROM cells is a first type ROM cell or a second type ROM cell, the first type ROM cell comprises:
    a first top metal structure;
    a first bottom metal structure, electrically isolated from the first top metal structure, and the second type ROM cell comprises:
    a second top metal structure;
    a second bottom metal structure; and
    a connection structure, electrically connecting the second top metal structure and the second bottom metal structure.

2. The ROM as claimed in claim 1, wherein the second top metal structure contact with a first end of the connection structure, and a second end of the connection structure contact with the second bottom metal structure.

3. The ROM as claimed in claim 1, wherein the word line driver comprises:
    a row address decoder, decoding a row address to generate a control signal;
    a row selecting circuit, coupled to the row address decoder, generating a plurality of word line enable signals according to the control signal; and
    a plurality of driving stages, generating the word line signals respectively according to the word line enable signals,
    wherein each of the word line signals equals to the reference voltage or be floated according to each of the word line enable signals.

4. The ROM as claimed in claim 3, wherein each of the driving stages comprises:
    a first transistor, a first end of the first transistor coupled to corresponding word line, a control end of the first transistor receives corresponding word line enable signal; and
    a second transistor, a first end of the second transistor coupled to a second end of the first transistor, a control end of the second transistor receiving the control signal, and a second end of the second transistor receiving the reference voltage.

5. The ROM as claimed in claim 1, wherein the first type ROM cell stores a data with a first logic value, the second type ROM cell stores a data with a second logic value, and the first logic value and the second logic value are complementary.

6. The ROM as claimed in claim 1, wherein the first top metal structure and the second top metal structure electrically coupling to the corresponding bit lines respectively.

7. The ROM as claimed in claim 1, wherein the first top metal structure and the second top metal structure electrically coupling to the corresponding word lines respectively.

8. The ROM as claimed in claim 1, wherein the first bottom metal structure and the second bottom metal structure electrically coupling to the corresponding bit lines respectively.

9. The ROM as claimed in claim 1, wherein the first bottom metal structure and the second bottom metal structure electrically coupling to the corresponding word lines respectively.

10. A data read method for reading data from the ROM as claimed in claim 1, comprising:
 pre-charging at least one selected bit line to a first voltage;
 setting a selected word line to a reference voltage and floating a plurality of un-selected word lines by the word line driver; and
 sensing a read-out data according to a voltage level on the at least one selected bit line,
 wherein, a voltage level of the first voltage is different from a voltage level of the reference voltage.

11. The data read method as claimed in claim 10, wherein the voltage level of the first voltage is larger than the voltage level of the reference voltage.

12. The data read method as claimed in claim 10, wherein step of sensing the read-out data according to the voltage level on the at least one selected bit line comprises:
 comparing the voltage level on the at least one selected bit line with a threshold voltage to generate a comparison result; and
 obtaining the read-out data according to the comparison result.

13. The data read method as claimed in claim 12, wherein step of obtaining the read-out data according to the comparison result comprises:
 if the voltage level on the at least one selected bit line is larger than the threshold voltage, the read-out is a first logic value; and
 if the voltage level on the at least one selected bit line is smaller than the threshold voltage, the read-out is a second logic value,
 wherein, the first logic value and the second logic value are complementary.

* * * * *